United States Patent [19]
Braun et al.

[11] Patent Number: 5,194,760
[45] Date of Patent: Mar. 16, 1993

[54] SLEW RATE LIMITED INDUCTIVE LOAD DRIVER

[75] Inventors: Jeffrey J. Braun, Mesa; Randall C. Gray, Tempe, both of Ariz.

[73] Assignee: Motorola, Inc., Schaumburg, Ill.

[21] Appl. No.: 812,444

[22] Filed: Dec. 23, 1991

[51] Int. Cl.[5] .......................... H03K 4/08; H03K 6/04
[52] U.S. Cl. ..................................... 307/263; 307/228; 328/128
[58] Field of Search ............... 307/228, 261, 263, 571, 307/253, 491; 328/127, 128, 184

[56] References Cited

U.S. PATENT DOCUMENTS

| | | | |
|---|---|---|---|
| 2,998,532 | 8/1961 | Smeltzer | 328/184 |
| 3,621,281 | 11/1971 | Hagen | 307/228 |
| 3,633,043 | 1/1972 | Anthony | 307/228 |
| 3,868,519 | 2/1975 | Green | 307/228 |
| 4,622,482 | 11/1986 | Ganger . | |
| 4,771,195 | 9/1988 | Stein . | |
| 4,779,013 | 10/1988 | Tanaka . | |
| 4,877,978 | 10/1989 | Platt . | |
| 4,906,867 | 3/1990 | Petty | 307/263 |
| 5,006,734 | 4/1991 | Engelbrecht . | |
| 5,013,940 | 5/1991 | Ansel . | |

Primary Examiner—William L. Sikes
Assistant Examiner—Toan Tran
Attorney, Agent, or Firm—Phillip H. Melamed

[57] ABSTRACT

A slew rate limited load driver is disclosed with a transistor switch (123) driving a load (125). The transistor switch (123) is controlled by a current from a current amplifier (107) and a current sink (111). The current amplifier (107) is driven from the combination of a source of compensating current (120) and a turn on current source (115). As a command signal (103) transitions, the source of compensating current (120) adds a transitional compensating current to the current derived from the turn on current source (115) and is amplified by the current amplifier (107). The output of the current amplifier (107) is combined with the output of the turn off current sink (111), to control the voltage slew rate to the load (101).

9 Claims, 2 Drawing Sheets

SLEW RATE LIMITED INDUCTIVE LOAD DRIVER

FIELD OF THE INVENTION

This invention is generally directed to the field of load drivers, and more particularly to those that limit the slew rate of the voltage driving a load.

BACKGROUND OF THE INVENTION

The slew rate, of a load driver circuit, is commonly defined as the maximum rate of change of the voltage driving the load. Load drivers are often designed to maximize the slew rate to get fast load response time. However, with certain loads, such as inductive solenoids, it is desirable to limit the slew rate. Limiting the slew rate limits electromagnetically radiated energy that can interfere with other circuits and systems.

Prior art relies on one of several schemes to limit the slew rate. One method includes a large capacitor connected between a drive transistor's control input and the load. This type of circuit suffers from many deficiencies. One deficiency is that the capacitor needs to be large to swamp out the effect of the drive transistor's variable internal capacitance. This size restriction causes an unnecessary burden on the circuit driving the drive transistor's control input. Also, the size of the capacitor makes it impractical to fit on an integrated circuit. Therefore, this scheme is more unreliable as more parts are used.

Another prior art solution is to include a large capacitor connected between a drive transistor's control input and circuit ground. Aside from having the same deficiencies as the prior circuit, the slew rate of the voltage driving the load varies as the load changes. This happens when the load changes because of manufacturing tolerances and aging.

DETAILED DESCRIPTION OF A PREFERRED EMBODIMENT

Figure 1:
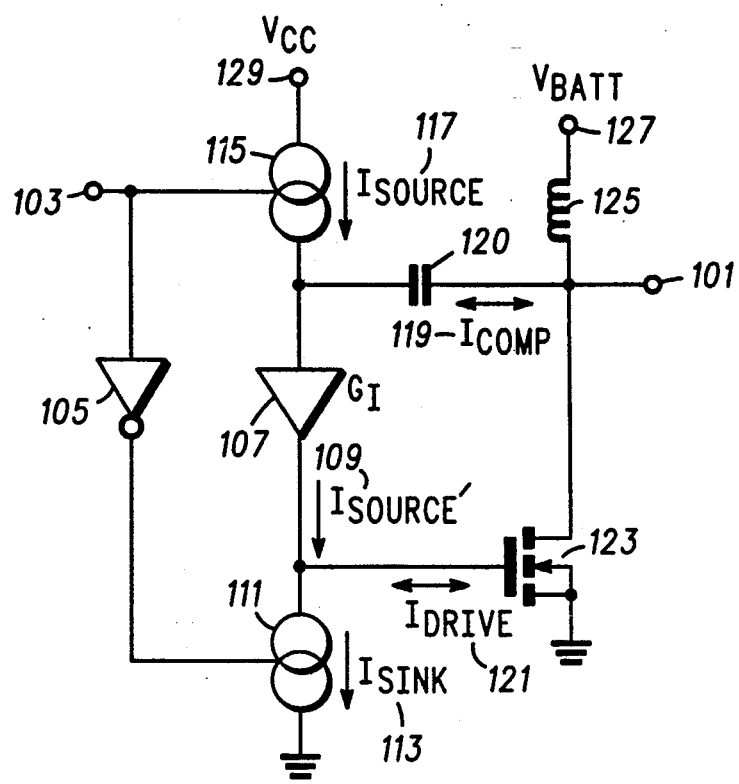
FIG. 1 is a schematic of a slew rate limited load driver in accordance with the invention.

FIG. 1 shows a schematic of a slew rate limited load driver.

Figure 2:
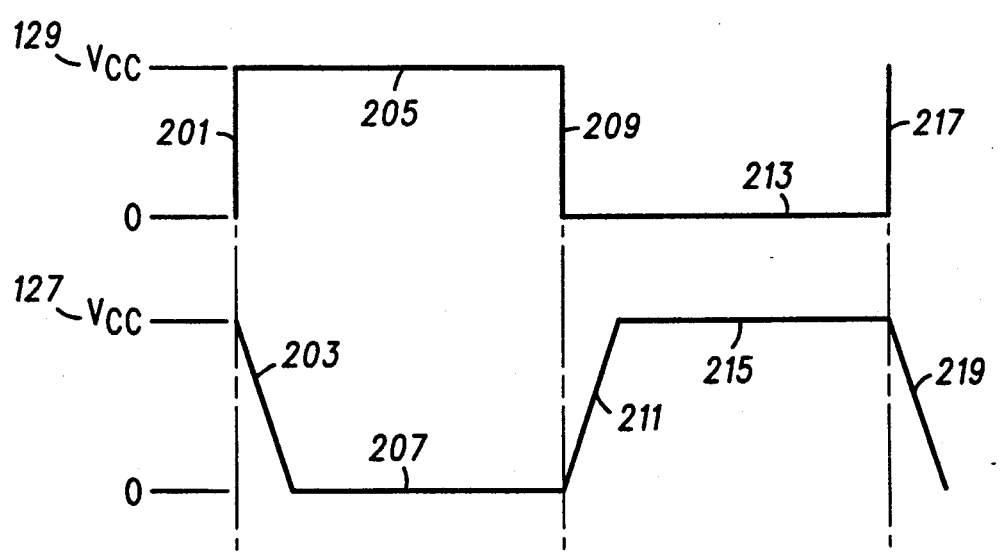
FIG. 2 is a diagram of the waveforms used to describe the operation of circuit 1.

FIG. 2 shows waveforms of the signals derived from this circuit. The top waveform, comprising elements 201, 205, 209, 213, and 217, is viewed at a control input 103. The bottom waveform, including 203, 207, 211, 215, and 219, is viewed at an output 101 representing the voltage across a load 125.

In FIG. 1 the load 125 is connected between Vbatt 127 and an output of a switch 123. In the preferred embodiment we use a field effect transistor switch. Other switch technologies can be substituted for this field effect transistor switch.

When the command signal 103 undergoes a transition 201 from zero to Vcc 129, a current source 115, supplying a turn on current, is enabled. This turn on current is identified as Isource 117 and is supplied to a current amplifier 107. The current amplifier 107 amplifies the current. The resulting amplified current is identified in FIG. 1 as Isource' 109. Because the command signal 103 undergoes a transition 201 from zero to Vcc 129 and is inverted with element 105, a current sink 111, that can provide a turn off current, is disabled. Because of this, Isource' 109 provides all of the current, represented in FIG. 1 as Idrive 121. Idrive 121 then drives a control input, or gate, of the transistor switch 123, charging the inherent gate to source capacitance. When the voltage at the gate builds to an adequate level, the transistor switch 123 begins to turn on and provide a transitioning voltage 203 to the load. This action results in a voltage differential being developed across a source of compensating current 120, in this case a capacitor, causing a compensating current, Icomp 119, to flow. This current, Icomp 119, is summed with Isource 117. In this example, the current Icomp 119 is flowing away from the input of the current amplifier 107. This results in less Idrive 121 for the transistor switch, slowing the transition of the voltage applied to the load. The effective drive current Idrive can be computed as follows:

$$Idrive = Isource' = G_I * \left[ Isource - \left[ C \frac{dv}{dt} \right] \right]$$

where:
$G_I$ = gain of the current amplifier 107
C = capacitance of element 120
dv = change of voltage from node 101 to ground
dt = change in time As the voltage at node 101 transits to zero volts it will transit at a rate determined by the combination of the turn on current Isource' 109 and the compensating current Icomp 119. Because a current amplifier 107 is employed to buffer the summed current signals, a small value capacitor 120 is used for constructing the source of compensating current 120. In the preferred embodiment we use a value of 4.6 pf. This is important as a capacitor of this size is easily integrateable onto an integrated circuit.

When the voltage at the node 101 reaches zero volts, as shown with voltage 207, the capacitor 120, and the compensating current it generates, Icomp 119 is no longer significant. This is because the voltage across the capacitor 120 is at rest. In this case the compensating current 119 is no longer effective and the transistor switch 123 is turned completely on.

Continuing, when the command signal 103 undergoes a transition from Vcc 129 to zero volts, inverter 105 inverts the command signal 103 and activates the current sink 113. When this happens the current source 115 is deactivated. This action causes Isource 117 to stop flowing. Because of this, a turn off current, Isink 111 provides all of the current, represented in FIG. 1 as Idrive 121. Idrive 121 then drives the gate of the transistor switch 123, discharging the charge held by the inherent gate to source capacitance.

When the voltage at the gate falls to an adequate level the transistor switch 123 begins to turn off and provide a transitioning voltage 211 to the load 125. This action develops a voltage differential across the capacitor 120, causing a compensating current, Icomp 119, to flow towards the current amplifier 107. This current, Icomp 119, is amplified by the current amplifier 107. The result is current Isource' that is additive to Isink 113, slowing the reduction of charge from the drive transistor's 123 gate. As the voltage at node 101 transits to Vbatt 127 it will transit at a rate determined by the combination of the current Isink 113 and Icomp 119. When the voltage at the node 101 reaches Vbatt 127 the compensating current, Icomp 120, is no longer effective as the voltage across capacitor 120 is at rest. Because of this the transistor switch 123 remains completely turned off.

Figure 3:
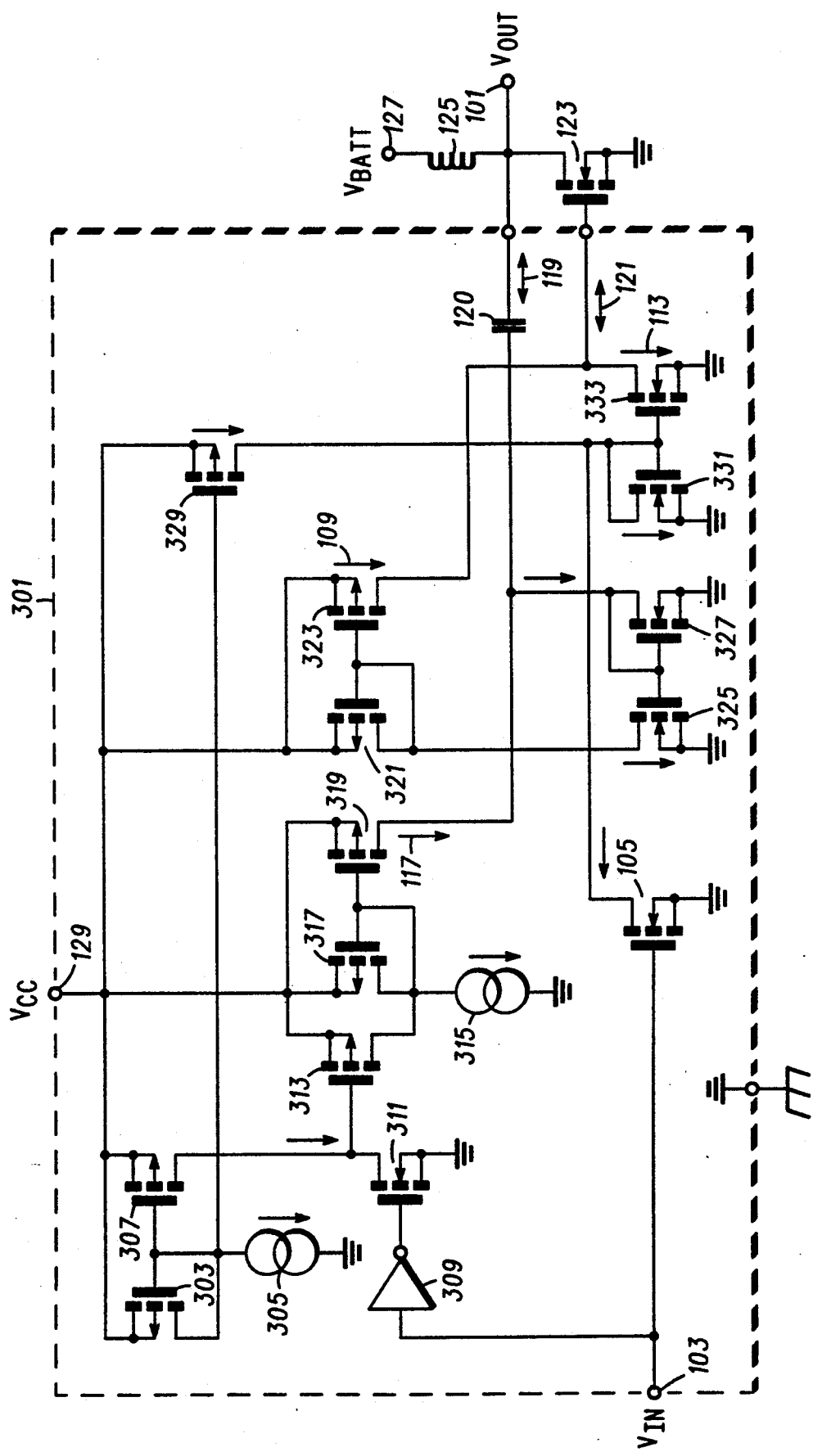
FIG. 3 is a schematic further detailing a monolithic integrated circuit slew rate limited load driver.

FIG. 3 shows the preferred embodiment in more detail. In the preferred embodiment the drive transistor's 123 control circuitry is located in an integrated circuit 301. For reference purposes elements 303 to 319 inclusive represent the turn on current source 115 from FIG. 1. Elements 321 to 327 inclusive represent the current amplifier 107 from FIG. 1. Elements 329 to 333 inclusive represent the current sink 111 from FIG. 1.

Benefits are realized from the use of a P-channel current amplifier, culminating in transistor 323. This includes that the integrated circuit 301 can be driven by Vcc instead of Vbatt. This is because the voltage loss, resulting from saturation of the transistor 323 is very low. This enables the transistor switch 123 to be driven on hard, ensuring a low Rds on, thus a low power dissipation.

Another benefit is stable operation of the circuit because of a minimal phase delay of output current through the capacitor 120, due to the low input impedance of transistor 327, and minimal phase delay in current mirrors.

Further, the slew rate can be easily determined and scaled for differing applications by adjusting the currents Isource 117 and Isink in relationship to the capacitance of the capacitor 120. To do this the following equation is useful.

$$\frac{dv}{dt} \text{(transition low)} = \frac{Isource}{C}$$

and $$\frac{dv}{dt} \text{(transition high)} = \frac{Isink}{C}$$

With the embodiment described we overcome the many deficiencies of the prior art and realize new benefits. By using a current amplifier we can use a small capacitor while swamping out the effects of the drive transistor's variable internal capacitance. This small capacitor is easily integrateable onto an integrated circuit. This topology also allows reduced bias currents over prior art. Load independence, from manufacturing tolerances and ageing, is ensured by using a control loop to control the voltage slew rate.

What is claimed is:

1. A slew rate limited driver for driving a load comprising:
   a switch having a control input and an output, the output being coupled to the load and, responsive to the control input, for applying a voltage having transitions to the load;
   a source of compensating current, responsive to the voltage applied to the load, for developing a compensating current in response to the transitions of the voltage applied to the load;
   a current source, for supplying a turn on current; and
   a current amplifier for summing and amplifying the compensating current and the turn on current, and for driving the control input of said switch to control the transitions of the voltage applied to the load.

2. A slew rate limited driver in accordance with claim 1 further comprising:
   a current sink, for supplying a turn off current, coupled to the control input of said switch wherein the combination of the amplified compensating current, the amplified turn on current, and the turn off current controls said switch such that additional transitions of the voltage applied to the load are controlled.

3. A slew rate limited driver in accordance with claim 1 wherein said current amplifier includes a P-channel MOSFET transistor.

4. A slew rate limited driver in accordance with claim 1 wherein said source of compensating current comprises a capacitor.

5. A slew rate limited driver for driving a load comprising:
   a switch having a control input and an output, the output being coupled to the load and, responsive to the control input, for applying a voltage having transitions to the load;
   a capacitor, responsive to the voltage applied to the load, for developing a compensating current in response to the transitions of the voltage applied to the load;
   a current source, for supplying a turn on current; and
   a current amplifier for summing and amplifying the compensating current and the turn on current, and for driving the control input of said switch to control the transitions of the voltage applied to the load.

6. A slew rate limited driver in accordance with claim 5 further comprising:
   a current sink, for supplying a turn off current, coupled to the control input of said switch wherein the combination of the amplified compensating current, the amplified turn on current, and the turn off current controls said switch such that additional transitions of the voltage applied to the load are controlled.

7. A slew rate limited driver in accordance with claim 5 wherein said current amplifier includes a P-channel MOSFET transistor.

8. A slew rate limited driver for driving a load comprising:
   a transistor switch having a control input and an output, the output being coupled to the load and responsive to the control input for applying a voltage having transitions to the load;
   a capacitor, responsive to the voltage applied to the load, for developing a compensating current in response to the transitions of the voltage applied to the load, said capacitor having a first electrode coupled to the output of said transistor switch, and a second electrode;
   a current source, for supplying a turn on current, having an output;
   a current sink, for supplying a turn off current, having an output coupled to the control input of said transistor switch; and
   a current amplifier having an input coupled to the second electrode of said capacitor and the output of said current source, for summing and amplifying the compensating current and the turn on current, and an output for driving the control input of said transistor switch wherein the combination of the amplified compensating current, the amplified turn on current, and the turn off current controls said transistor switch such that the transitions of voltage applied to the load are controlled.

9. A slew rate limited driver in accordance with claim 8 wherein said current amplifier includes a P-channel MOSFET transistor.

* * * * *